(12) United States Patent
Nakamura et al.

(10) Patent No.: US 9,166,765 B2
(45) Date of Patent: Oct. 20, 2015

(54) HIGH-FREQUENCY CIRCUIT MODULE (71) Applicant: TAIYO YUDEN CO., LTD., Tokyo (JP)

(72) Inventors: Hiroshi Nakamura, Tokyo (JP);
Tomohiro Igarashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 106 days.

(21) Appl. No.: 13/963,775

(22) Filed: Aug. 9, 2013

(65) Prior Publication Data

US 2014/0056183 A1 Feb. 27, 2014

Related U.S. Application Data

(63) Continuation of application No. 13/593,141, filed on Aug. 23, 2012, now Pat. No. 8,536,957.

(30) Foreign Application Priority Data

Aug. 21, 2012 (JP) .................................. 2012-182286

(51) Int. Cl.
*H04B 1/50* (2006.01)
*H03H 7/46* (2006.01)
(Continued)

(52) U.S. Cl.
CPC .......... *H04L 5/1461* (2013.01); *H01L 23/3735* (2013.01); *H04B 1/0057* (2013.01);
(Continued)

(58) Field of Classification Search
CPC ......... H03H 7/46; H03H 7/461; H03H 7/463;
H03H 9/0538; H03H 9/0542; H03H 9/0547;
H03H 9/0552; H03H 9/0557; H03H 9/0561;
H03H 9/0566; H03H 9/0571; H03H 9/0576;
H03H 9/08; H01L 23/3735; H01L
2224/16225; H05K 1/0206; H05K 1/0207;
H05K 1/185; H05K 1/0216; H05K 1/0237;
H05K 1/0243; H04L 5/14; H04L 5/1461;
H04B 1/44; H04B 1/50; H04B 1/0057
USPC ........... 333/132, 133; 370/278, 282; 361/704,
361/707, 712; 455/78, 82, 83
See application file for complete search history.

(56) References Cited

U.S. PATENT DOCUMENTS 6,501,945 B1 12/2002 Chien
6,818,979 B2 11/2004 Takehara et al.
(Continued)

FOREIGN PATENT DOCUMENTS

EP 1 089 375 B1 5/2008
JP 2005-198051 A 7/2005
(Continued)

OTHER PUBLICATIONS

U.S. Appl. No. 14/077,697, filed Nov. 12, 2013 and U.S. Appl. No. 14/150,599, filed Jan. 8, 2014.
(Continued)

*Primary Examiner* — Barbara Summons
(74) *Attorney, Agent, or Firm* — Chen Yoshimura LLP (57) ABSTRACT

Provided is a high-frequency circuit module that has high mounting density. In a high-frequency circuit module, an RFIC that performs transmission and reception processes for high-frequency signals, a power amplifier IC that amplifies a transmission signal from the RFIC, and a duplexer that separates a transmission signal outputted from the power amplifier IC to an antenna and a reception signal that is inputted from the antenna to the RFIC are formed on the top surface thereof. The duplexer is disposed between the RFIC and the power amplifier IC.

15 Claims, 5 Drawing Sheets

(51) Int. Cl.
   *H04L 5/14* (2006.01)
   *H01L 23/373* (2006.01)
   *H05K 1/02* (2006.01)
   *H04B 1/00* (2006.01)
   *H03H 9/05* (2006.01)
   *H03H 9/08* (2006.01)

(52) U.S. Cl.
   CPC ............ *H05K1/0207* (2013.01); *H05K 1/0216* (2013.01); *H05K 1/0237* (2013.01); *H01L 2224/16225* (2013.01); *H03H 7/463* (2013.01); *H03H 9/0547* (2013.01); *H03H 9/08* (2013.01)

(56) References Cited

U.S. PATENT DOCUMENTS

| | | | |
|---|---|---|---|
| 6,873,529 | B2 | 3/2005 | Ikuta et al. |
| 6,879,488 | B2 | 4/2005 | Takeda et al. |
| 7,289,008 | B2 | 10/2007 | Kuroki et al. |
| 8,483,104 | B1 | 7/2013 | Saji et al. |
| 8,536,957 | B1 | 9/2013 | Nakamura et al. |
| 8,830,010 | B2 * | 9/2014 | Nakamura et al. ............ 333/132 |
| 8,872,600 | B2 * | 10/2014 | Nakamura et al. ............ 333/132 |
| 2004/0067771 | A1 | 4/2004 | Wieck |
| 2005/0104685 | A1 | 5/2005 | Kuroki et al. |
| 2005/0151599 | A1 | 7/2005 | Ido et al. |
| 2006/0068748 | A1 | 3/2006 | Irie et al. |
| 2006/0276158 | A1 | 12/2006 | Okabe |
| 2008/0174684 | A1 | 7/2008 | Narita |
| 2008/0212552 | A1 | 9/2008 | Fukamachi et al. |
| 2009/0116510 | A1 | 5/2009 | Georgantas et al. |
| 2011/0304388 | A1 | 12/2011 | Yamawaki et al. |
| 2013/0043584 | A1 | 2/2013 | Kwon et al. |
| 2013/0163212 | A1 | 6/2013 | Tanaka et al. |
| 2014/0055956 | A1 | 2/2014 | Nakamura et al. |

FOREIGN PATENT DOCUMENTS

| | | |
|---|---|---|
| JP | 2006-073673 A | 3/2006 |
| JP | 2006-121147 A | 5/2006 |
| JP | 2006-180336 A | 7/2006 |
| JP | 2006-203652 A | 8/2006 |
| JP | 2006-340257 A | 12/2006 |
| JP | 2008-72738 A | 3/2008 |
| JP | 2010-161801 A | 7/2010 |
| JP | 2011-187831 A | 9/2011 |

OTHER PUBLICATIONS

Okabe et al., "Compact Radio System Module for Triple-band GSM Cellular Phones", 2005 IEEE Radio Frequency Integrated Circuits (RFIC) Symposium, Jun. 12-14, 2005, pp. 273-276.

Park et al., "Thermal Analysis of Fully Integrated RF Single-Package Module for GSM Quad Band Handsets", Proceedings of the 6th International Conference on Thermal, Mechanical and Multiphysics Simulation and Experiments in Micro-Electronics and Micro-Systems, EuroSimE 2005, Apr. 18-20, 2005, pp. 670-674.

Japanese Office Action dated on Sep. 25, 2013, in a counterpart Japanese patent application No. 2013-179365.

Japanese Office Action dated on Nov. 20, 2013, in a counterpart Japanese patent application No. 2013-179365.

Japanese Office Action dated on Sep. 25, 2013, in a counterpart Japanese patent application No. 2013-179357.

Taiwanese Office Action dated on Dec. 2, 2014, in a counterpart Taiwanese patent application No. 102127438.

* cited by examiner

HIGH-FREQUENCY CIRCUIT MODULE

This application is a Continuation of a pending application, U.S. application Ser. No. 13/593,141 filed on Aug. 23, 2012 and claims the benefit of Japanese Application No. 2012-182286, filed in Japan on Aug. 21, 2012, both of which are hereby incorporated by reference in their entireties.

TECHNICAL FIELD

The present invention relates to a high-frequency circuit module in which a high-frequency IC, a power amplifier IC, and a duplexer are mounted on a circuit substrate, and more particularly, to an arrangement of the respective components.

BACKGROUND ART

In recent years, mobile phones are becoming more sophisticated and smaller as represented by multi-function mobile phones, i.e., smart phones. In such mobile phones, a high-frequency circuit module, in which various components that are necessary for transmitting and receiving high-frequency signals are mounted on a circuit substrate, is provided on a mother board (see Patent Document 1, for example). In the high-frequency circuit module described in Patent Document 1, a high-frequency IC that performs transmission and reception processes for high-frequency signals, a power amplifier IC that amplifies transmission signals, a transmission filter, a reception filter, a high-frequency switch, and the like are provided on a circuit substrate. An output signal from the power amplifier IC passes through a transmission matching circuit, the transmission filter, and the high-frequency switch in this order, and is transmitted from an antenna. On the other hand, a reception signal from the antenna is inputted into the high-frequency IC, passing through the high-frequency switch, the reception filter, and a reception matching filter in this order. On the circuit substrate, a signal line from the high-frequency IC to the high-frequency switch, through which the transmission signal is transmitted, and a signal line from the high-frequency switch to the high-frequency IC, through which the reception signal is transmitted, are formed so as not to intersect with each other or not to be close to each other.

RELATED ART DOCUMENTS

Patent Documents

Patent Document 1: Japanese Patent Application Laid-Open Publication No. 2005-198051
Patent Document 2: Japanese Patent Application Laid-Open Publication No. 2006-340257

SUMMARY OF THE INVENTION

Problems to be Solved by the Invention

However, with the conventional technology, it was difficult to meet the recent demands for further size reduction and density improvement. In the configuration described in Patent Document 1, the power amplifier IC is disposed close to the high-frequency IC, and therefore, with the further size reduction and density improvement, the signal line for the reception signal would be placed closer to the power amplifier IC, which would cause a problem of a noise or leak signal generated in the power amplifier IC flowing into the reception circuit of the high-frequency IC. In the configuration described in Patent Document 2, although a W-PA-IC (121), which corresponds to the power amplifier IC, and a high-frequency IC (310) are located apart from each other in the W-CDMA block that is the first communication system, a duplexer (100) is also disposed apart from the high-frequency IC (310), causing a problem of a noise, leak signal, or the like generated in the power amplifier IC being mixed into the reception signal that has passed through the duplexer (100) and flowing into the reception circuit of the high-frequency IC.

The present invention was made in view of the above-mentioned problems, and aims at providing a high-frequency circuit module that can achieve high mounting density.

Means for Solving the Problems

In order to achieve the above-mentioned objective, a high-frequency circuit module according to the present invention includes: a circuit substrate having laminated insulating layers and conductive layers; a high-frequency IC that performs a transmission process and a reception process for a high-frequency signal; a power amplifier IC that amplifies a transmission signal from the high-frequency IC, and a duplexer that separates a transmission signal and a reception signal, the transmission signal being outputted from the power amplifier IC toward an antenna, the reception signal being inputted from the antenna toward the high-frequency IC, wherein a wiring length of a signal line that is used for sending a transmission signal that has been amplified by the power amplifier IC to the duplexer is shorter than a signal line that is used for sending to the power amplifier IC a transmission signal that is outputted from the high-frequency IC and that has not been amplified.

According to the present invention, the signal line that is used for sending a reception signal from the duplexer to the high-frequency IC is not placed near the power amplifier IC. Also, it is possible to shorten the length of the signal line that is used for sending a reception signal from the duplexer to the high-frequency IC. This makes it easier to achieve the smaller size and higher density while preventing a noise from flowing into the reception circuit of the high-frequency IC. A transmission signal outputted from the high-frequency IC is inputted into the power amplifier IC after passing through an area near the duplexer. However, because the transmission signal has not been amplified yet, the effect thereof to the duplexer, other circuits, and the like is very small. On the other hand, because the power amplifier IC and the duplexer are close to each other, the length of the signal line that is used for sending the amplified transmission signal can be shortened. That is, the signal line that is used for sending a signal that has been amplified by the power amplifier IC to the duplexer can be made shorter than the signal line that is used for sending an output signal from the high-frequency IC that has not been amplified. This makes it possible to reduce a power loss and radiation noise. The duplexer may be mounted on the circuit substrate, or may be embedded in the circuit substrate.

In one preferred exemplary configuration, the power amplifier IC may be mounted in a peripheral portion of the circuit substrate. This makes it possible to dispose the high-frequency IC inside of the peripheral portion of the circuit substrate. In recent years, the high-frequency IC is provided with many terminals to achieve multiple functions and a capability of handling multiple bands. For this reason, to make it easier to design the circuit pattern and to minimize the wiring length, it is more desirable to dispose the high-frequency IC inside of the peripheral portion of the circuit substrate. The present invention is effective from such perspectives.

The high-frequency circuit module is typically configured such that many terminal electrodes are disposed in the peripheral portion of the bottom surface of the circuit substrate, and such that a ground electrode is provided in a region inside of the area where the terminal electrodes are formed. Therefore, when the power amplifier IC is mounted in the peripheral portion of the circuit substrate as described above, it is preferable to use a circuit substrate that includes a core layer as a conductive layer that is thicker than other conductive layers and that can function as a ground, a first via conductor for heat dissipation that connects the bottom surface of the power amplifier IC to the core layer, and a second via conductor for heat dissipation that connects the core layer to the ground electrode formed on the bottom surface of the circuit substrate from a perspective of heat dissipation.

In the high-frequency circuit module according to the present invention, the circuit substrate may include: a conductive layer as a core layer that is thicker than other conductive layers and that functions as a ground; a terminal electrode formed in a peripheral portion on a bottom surface of the circuit substrate; a first via conductor for heat dissipation that connects a bottom surface of the power amplifier IC to the core layer; a ground electrode that is formed in a region inside of an area where the terminal electrode is formed on the bottom surface of the circuit substrate; and a second via conductor for heat dissipation that connects the ground electrode to the core layer.

In the high-frequency circuit module according to the present invention, at least a portion of the duplexer may be disposed between the high-frequency IC and the power amplifier IC.

In the high-frequency circuit module according to the present invention, the high-frequency IC and the power amplifier IC may be mounted on a top surface of the circuit substrate.

In the high-frequency circuit module according to the present invention, in a side view, the duplexer may be disposed in a level different from a level in which the high-frequency IC and the power amplifier IC are disposed.

In the high-frequency circuit module according to the present invention, a wiring length of a signal line that is used for sending a reception signal from the duplexer to the high-frequency IC may be shorter than a signal line that is used for sending to the power amplifier IC a transmission signal that is outputted from the high-frequency IC and that has not been amplified.

In another aspect, a high-frequency circuit module according to the present invention includes: a circuit substrate having laminated insulating layers and conductive layers; a high-frequency IC that performs a transmission process and a reception process for a high-frequency signal; a power amplifier IC that amplifies a transmission signal from the high-frequency IC; and a duplexer that separates a transmission signal and a reception signal, the transmission signal being outputted from the power amplifier IC toward an antenna, the reception signal being inputted from the antenna toward the high-frequency IC, wherein a wiring length of a signal line that is used for sending a reception signal from the duplexer to the high-frequency IC is shorter than a signal line that is used for sending to the power amplifier IC a transmission signal that is outputted from the high-frequency IC and that has not been amplified.

Effects of the Invention

As described above, according to the present invention, the signal line that is used for sending a reception signal from the duplexer to the high-frequency IC is not placed near the power amplifier IC, and the length of the signal line that is used for sending a reception signal from the duplexer to the high-frequency IC can be shortened. This makes it easier to achieve the reduction in size and density improvement while preventing noise from flowing into the reception circuit of the high-frequency IC.

DETAILED DESCRIPTION OF EMBODIMENTS

Figure 1:
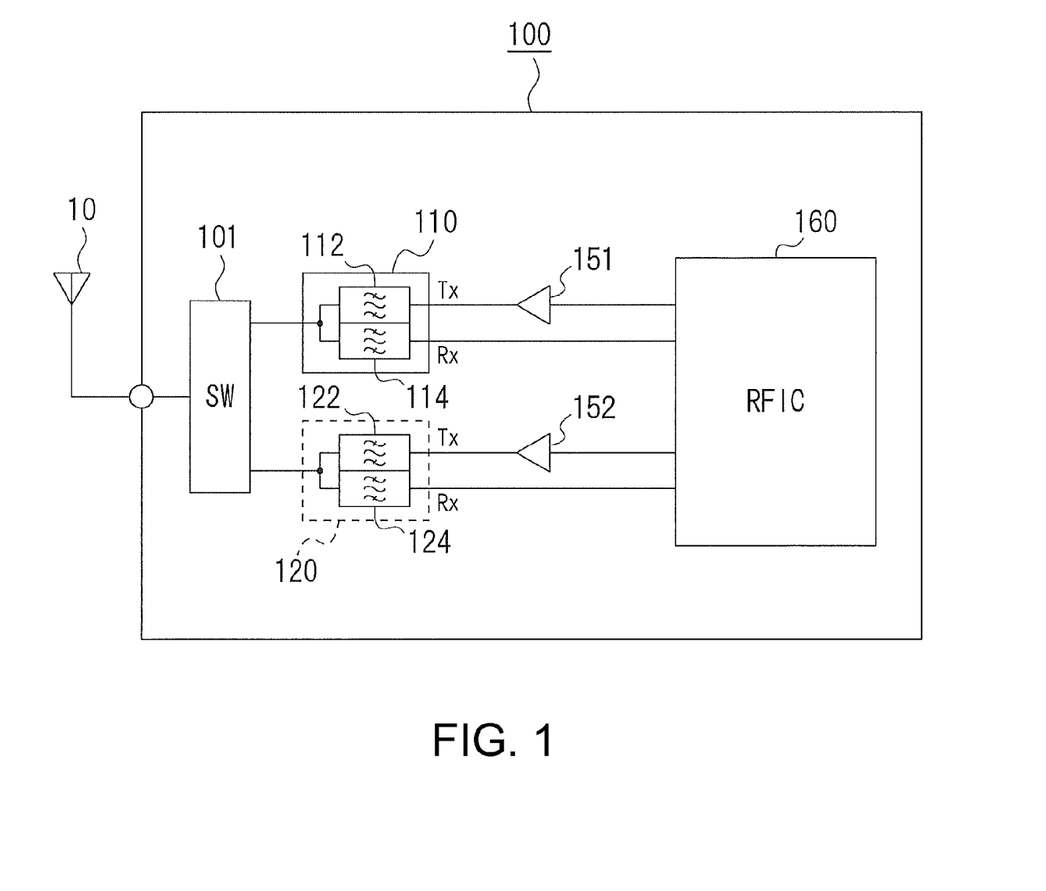
FIG. 1 is a schematic circuit diagram of a high-frequency circuit module.

A high-frequency circuit module according to Embodiment 1 of the present invention will be explained with reference to figures. FIG. 1 shows a schematic circuit diagram of the high-frequency circuit module. In the present embodiment, for ease of explanation, configurations concerning the gist of the present invention will be mainly explained.

A high-frequency circuit module 100 according to the present embodiment is used for a mobile phone that is capable of handling two frequency bands. As shown in FIG. 1, the high-frequency circuit module 100 includes a high-frequency switch 101, first and second duplexers 110 and 120, high-frequency power amplifiers 151 and 152 for transmission, and an RFIC (Radio Frequency Integrated Circuit) 160. In the actual circuit configuration, a matching circuit, a bandpass filter for transmission signals, and the like are provided for each frequency band, but they are omitted in the present embodiment for ease of explanation.

The high-frequency switch 101 switches connections from the respective first and second duplexers 110 and 120 to an external antenna 10.

The respective duplexers 110 and 120 include transmission filters 112 and 122 and reception filters 114 and 124, respectively. As the transmission filters 112 and 122 and the reception filters 114 and 124, various filters such as surface acoustic wave (SAW) filters and bulk acoustic wave (BAW) filters can be used. In the present embodiment, the SAW filters are used. The transmission filters 112 and 122 are connected to transmission ports of the RFIC 160 through the high-frequency power amplifiers 151 and 152, respectively. The reception filters 114 and 124 are connected to reception ports of the RFIC 160. The high-frequency power amplifiers 151 and 152 are packaged into a single power amplifier IC 155. The RFIC 160 performs transmission and reception processes such as a modulation/demodulation process and a multiplexing process to high-frequency signals.

Figure 2:
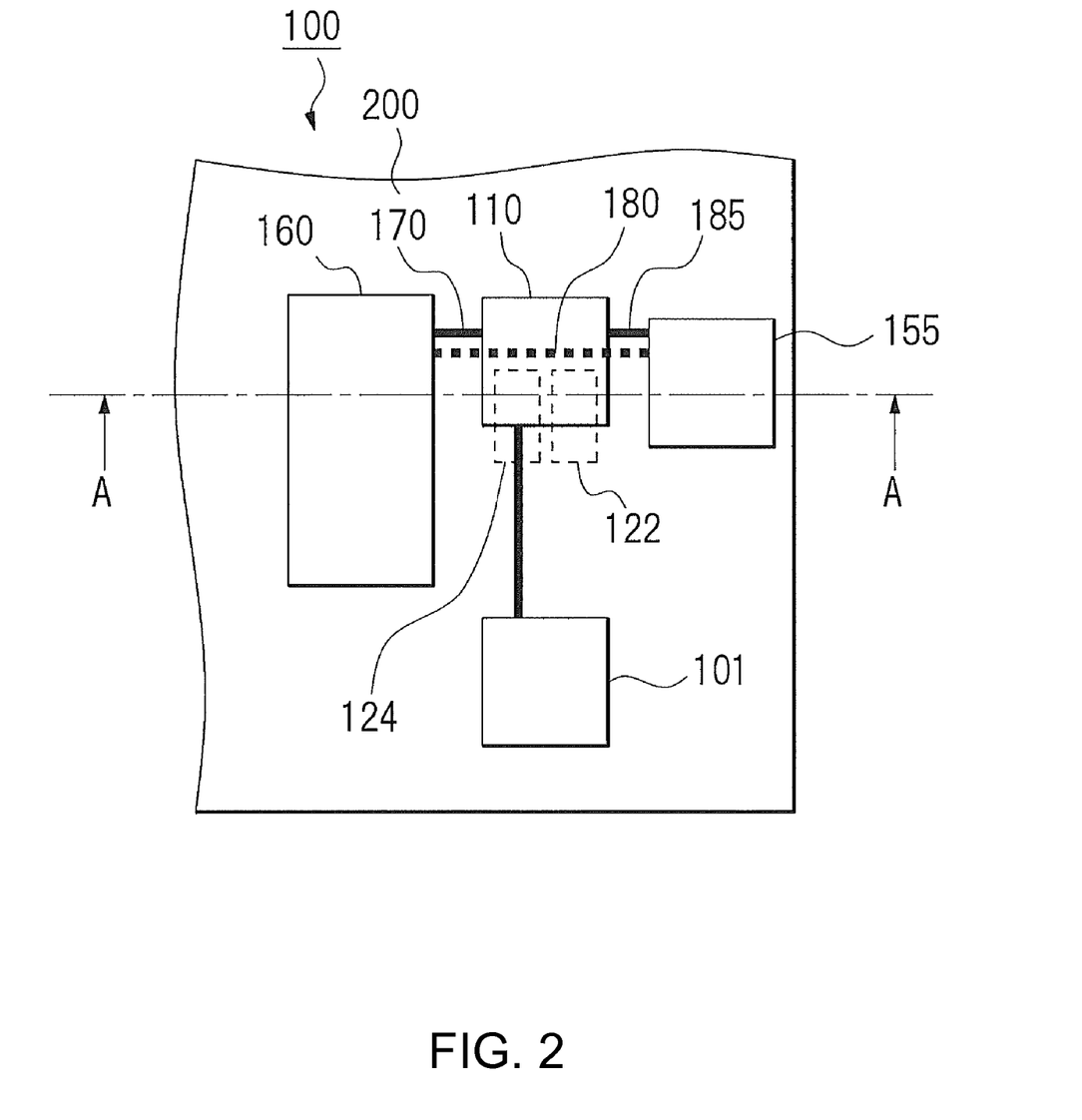
FIG. 2 is a top view of the high-frequency circuit module.
Figure 3:
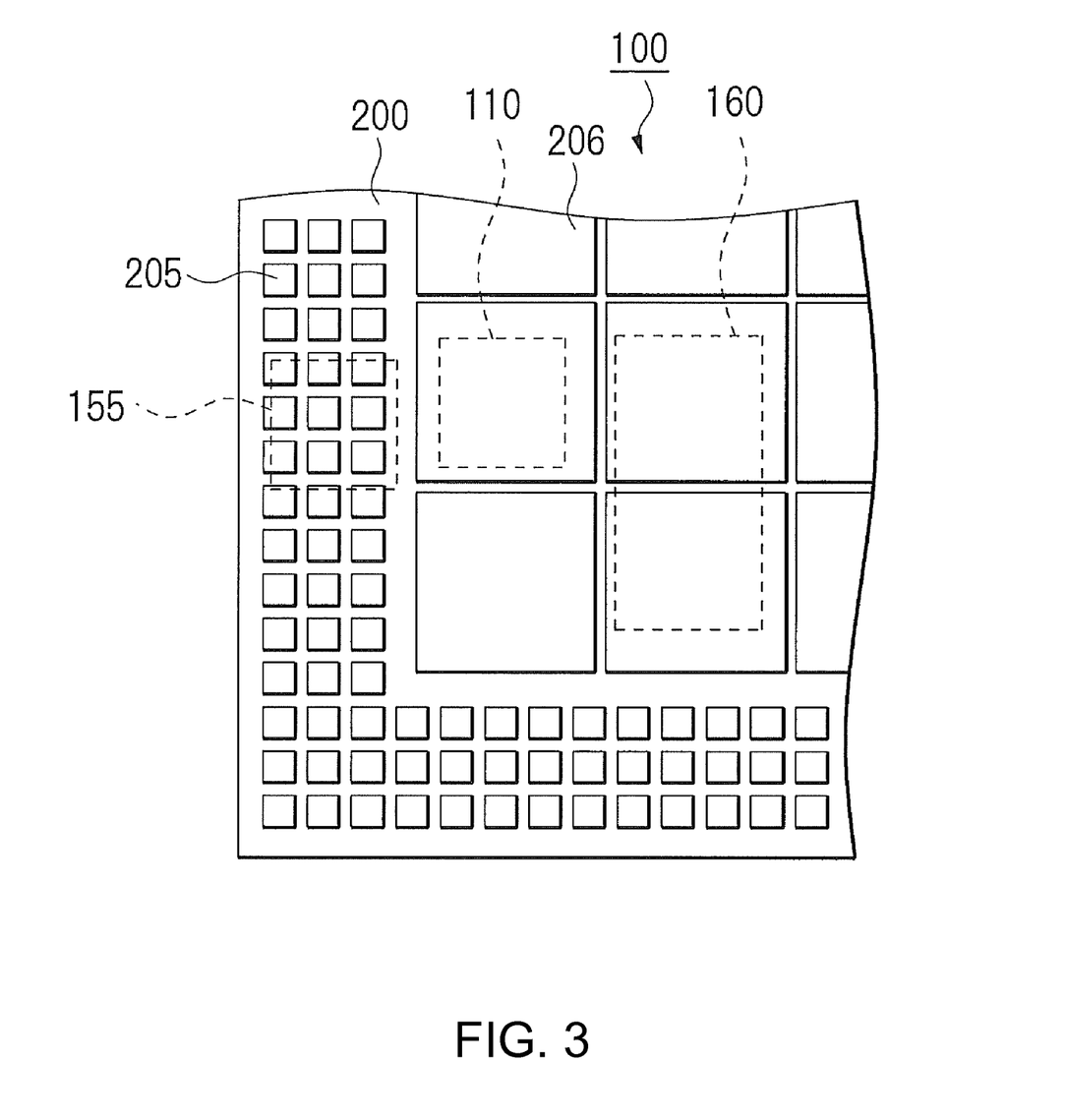
FIG. 3 is a bottom view of the high-frequency circuit module.
Figure 4:
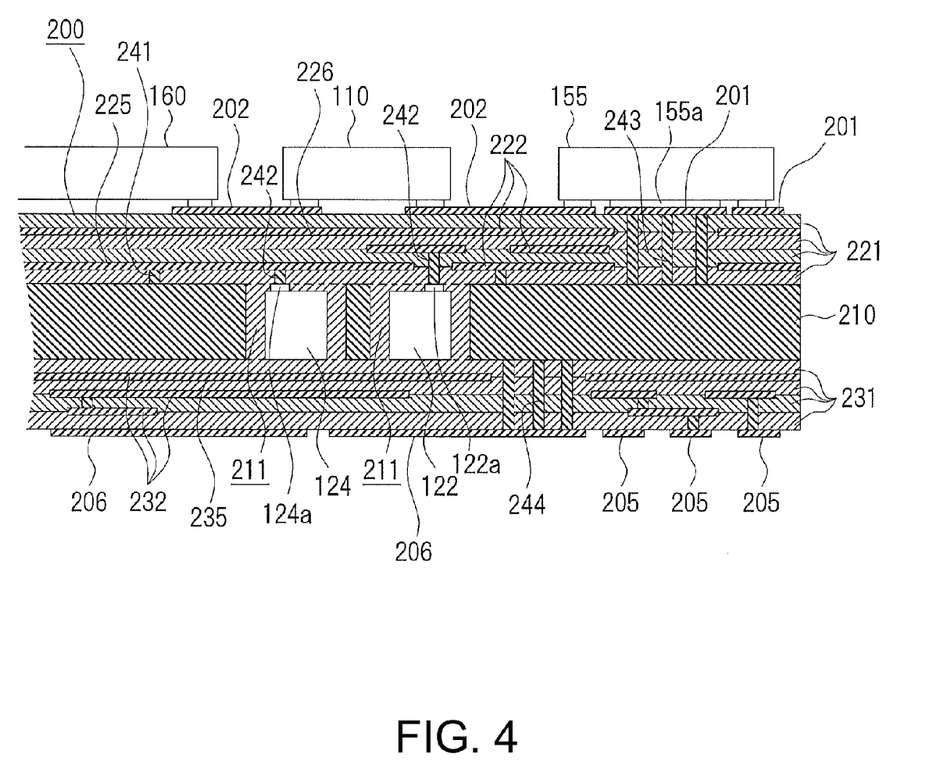
FIG. 4 is a cross-sectional view of the high-frequency circuit module.

Next, with reference to FIGS. 2 to 4, a structure of the high-frequency circuit module 100 will be explained. FIG. 2 is a top view of the high-frequency circuit module, FIG. 3 is a bottom view of the high-frequency circuit module, and FIG. 4 is a cross-sectional view along the line indicated by the arrows A in FIG. 2.

As shown in FIG. 2, in the high-frequency circuit module 100, the RFIC 160, the first duplexer 110, the power amplifier IC 155, and the high-frequency switch 101 are surface-mounted on the top surface of the circuit substrate 200. The first duplexer 110 is configured such that the first transmission filter 112 and the first reception filter 114 are enclosed in a package for surface mounting. On the other hand, the second duplexer 120 is embedded in the circuit substrate 200. The second duplexer 120 is configured such that the constituting elements thereof (such as a transmission filter and a reception filter) are embedded in the circuit substrate 200 as separate components, respectively. That is, the second duplexer 120 is not enclosed in a package, unlike the first duplexer 110.

The circuit substrate 200 is a multi-layer substrate formed by alternately laminating insulating layers and conductive layers. As shown in FIG. 4, the circuit substrate 200 includes a metal conductive layer as a core layer 210 that has excellent conductivity and that is relatively thick, a plurality of insulating layers 221 and conductive layers 222 that are formed on one of the main surfaces (top surface) of the core layer 210, and a plurality of insulating layers 231 and conductive layers 232 that are formed on the other main surface (bottom surface) of the core layer 210. The insulating layers 221 and 231 and the conductive layers 222 and 232 are formed on the respective main surfaces of the core layer 210 by the build-up method. Two of the conductive layers 222 that are interposed between the core layer 210 and one of the main surfaces (top surface) of the circuit substrate 200, and one of the conductive layers 232 that are interposed between the core layer 210 and the other main surface (bottom surface) of the circuit substrate 200 are respectively used as ground conductive layers 225, 226, and 235 that are provided with a reference potential (ground). The ground conductive layers 225 and 235 are the conductive layers 222 and 232 respectively closest to the core layer 210, and are connected to the core layer 210 through via conductors 241, respectively. With this configuration, the core layer 210 can also be used as a ground conductor. Also, between the two ground conductive layers 225 and 226, the conductive layer 222 is interposed, and wiring formed in the conductive layer 222 serves as a stripline. On one of the main surfaces (top surface) of the circuit substrate 200, wiring 202 and conductive lands 201 for part mounting are formed. In the peripheral portion of the other main surface (bottom surface) of the circuit substrate 200, a plurality of terminal electrodes 205 are formed. In a region inside of the area where the terminal electrodes 205 are formed on the main surface (bottom surface) of the circuit substrate 200, a plurality of ground electrodes 206, each of which has a larger area than that of a terminal electrode 205, are formed. The lands 201 have the RFIC 160, the first duplexer 110, and the power amplifier IC 155 soldered thereto.

In the core layer 210, penetrating holes 211 are formed to place components therein. In the penetrating holes 211, the second transmission filter 122 and the second reception filter 124 that constitute the second duplexer 120 are placed, respectively. Therefore, it is preferable that the thickness of the core layer 210 be larger than the height of the components that are placed therein. In the present embodiment, the core layer 210 is made of a metal plate, and more specifically, is made of a copper or copper alloy metal plate. In each penetrating hole 211, a gap around the component placed therein is filled with an insulator such as a resin, which is formed integrally with the insulating layers 221 and 231. On the top surfaces of the second transmission filter 122 and the second reception filter 124, terminal electrodes 122a and 124a are formed. The terminal electrodes 122a and 124a are respectively connected to the conductive layer 222 through via conductors 242.

As shown in FIG. 2, in the high-frequency circuit module 100 according to the present invention, the first duplexer 110 and the second duplexer 120 are disposed between the RFIC 160 and the power amplifier IC 155. This makes it possible to shorten the length of a signal line 170 that is used for sending a reception signal inputted from the first duplexer 110 and the second duplexer 120 to the RFIC 160. Also, this makes it possible to minimize the mixture of noise into the signal line 170. In the example shown in FIG. 2, a reception signal outputted from the first duplexer 110 is inputted into the RFIC 160 through the signal line 170 formed on the top surface of the circuit substrate 200. On the other hand, a transmission signal outputted from the RFIC 160 is inputted into the power amplifier IC 155 through a signal line 180 that is formed in an inner layer of the circuit substrate 200, i.e., the conductive layer 222 that is interposed between the two ground conductive layers 225 and 226. The amplified transmission signal that is outputted from the power amplifier IC is inputted into the first duplexer 110 through a signal line 185 that is formed on the top surface of the circuit substrate 200. It should be noted that the signal line 185 that is used for sending the signal that has been amplified by the power amplifier IC is shorter than the signal line 180 that is used for sending an output signal from the RFIC 160 that has not been amplified. In FIG. 2, input/output signal lines for the second duplexer 120 are not shown for ease of explanation.

As shown in FIGS. 2 and 3, in the high-frequency circuit module 100 according to the present invention, the power amplifier IC 155 is mounted in the peripheral portion of the circuit substrate 200. As shown in FIG. 3, the power amplifier IC 155 is located such that the projection region thereof that is formed by projecting the power amplifier IC 155 in the thickness direction of the circuit substrate 200 overlaps the region where the terminal electrodes 205 are formed. Also, as shown in FIG. 4, a ground terminal 155a of the power amplifier IC 155 is mounted on the land 201 on the circuit substrate 200, and the land 201 is connected to the core layer 210 through a plurality of via conductors 243 for heat dissipation. The core layer 210 is also connected to the ground electrode 206 on the bottom surface through a plurality of via conductors 244 for heat dissipation. With this configuration, heat generated in the power amplifier IC 155 is transferred in the thickness direction of the circuit substrate 200 through the via conductors 243, and is transferred to the right and to the left along the core layer 210. Heat in the core layer 210 is transferred to the ground electrode 206 through the via conductors 244, and is released to the main circuit substrate to which the circuit substrate 200 is mounted.

According to the high-frequency circuit module 100 described above, the duplexers 110 and 120 are disposed between the RFIC 160 and the power amplifier IC 155, and therefore, the signal line that is used for sending a reception signal from the duplexers 110 and 120 to the RFIC 160 is not placed near the power amplifier IC 155. Also, the length of the signal line that is used for sending a reception signal from the duplexers 110 and 120 to the RFIC 160 can be shortened. This makes it easier to achieve the size reduction and density improvement while preventing a noise from flowing into the reception circuit of the RFIC 160. A transmission signal outputted from the RFIC 160 is inputted into the power amplifier IC 155, passing through an area near the duplexers 110 and 120. However, because the transmission signal has not been amplified yet, the effect thereof to the duplexers 110 and 120, other circuits, and the like is very small. On the other hand, because the power amplifier IC 155 and the duplexers 110 and 120 are disposed adjacent to each other, the length of the signal line that is used for sending the amplified transmission signal can be shortened. This makes it possible to reduce a power loss or radiation noise.

In the high-frequency circuit module 100 according to the present embodiment, even if the power amplifier IC 155 is disposed in the peripheral portion of the circuit substrate 200, heat generated in the power amplifier IC can be released to the main circuit substrate through the via conductors 243 and 244 for heat dissipation and the core layer 210. Therefore, it becomes possible to dispose the RFIC 160 inside of the peripheral portion of the circuit substrate. This makes it easier to design the component arrangement and the circuit pattern near the RFIC 160 in particular, and because the wiring length can be shortened, excellent high-frequency characteristics can be achieved.

Figure 5:
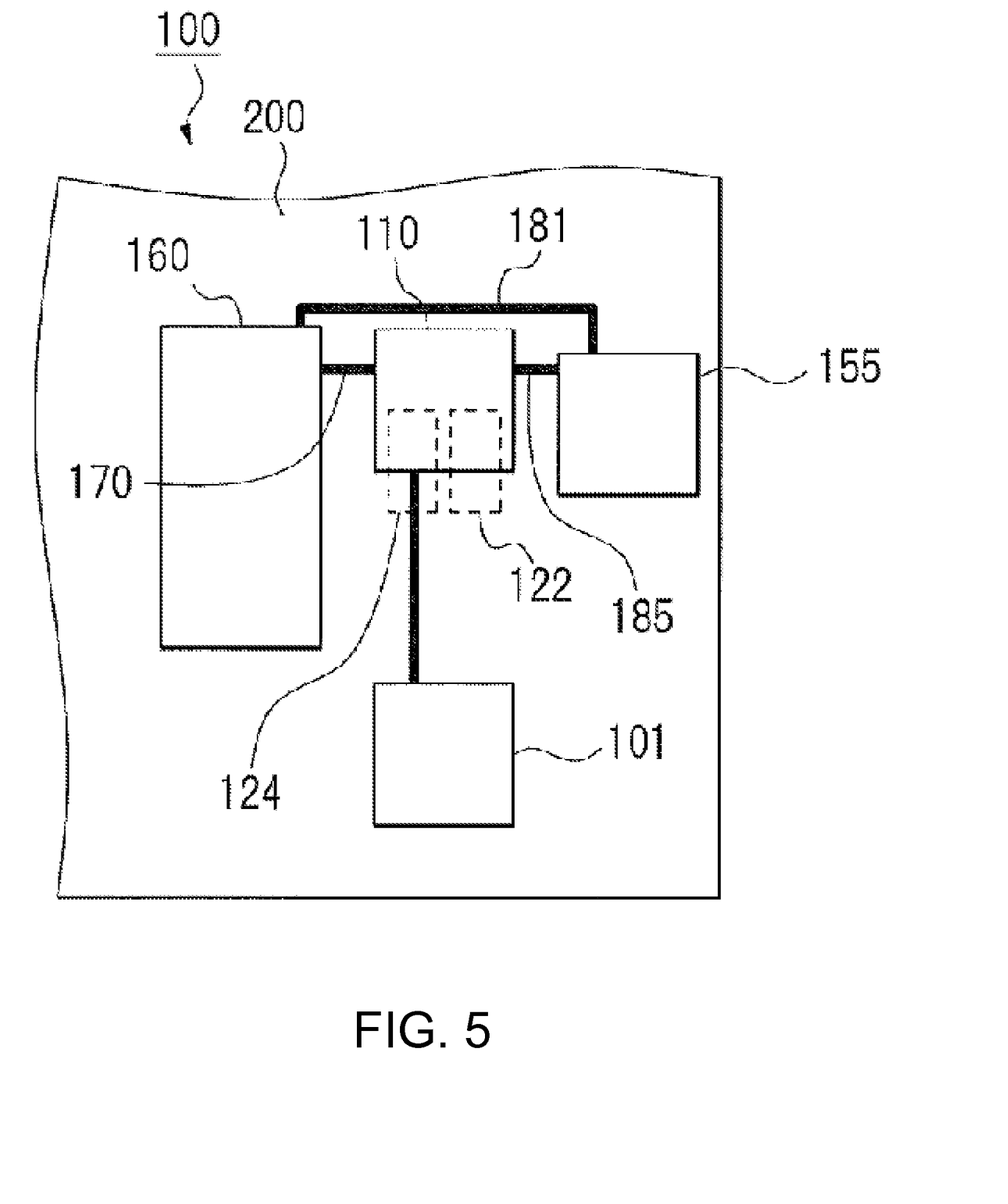
FIG. 5 is a top view of a high-frequency circuit module according to another embodiment.

One embodiment of the present invention was described above, but the present invention is not limited to such. For example, in the above embodiment, a transmission signal outputted from the RFIC 160 was inputted into the power amplifier IC 155 through the signal line 180 that is formed in the inner layer of the circuit substrate 200, but as shown in FIG. 5, it is also possible to input the signal into the power amplifier IC 155 through a signal line 181 that is formed on the circuit substrate 200.

In the above embodiment, copper and a copper alloy were given as examples of the material of the core layer 210, but any material including metals, alloys, and resins can be used. The core layer 210 may or may not have conductivity. In the above embodiment, the circuit substrate 200 was described as a substrate that has the core layer 210, which is relatively thick, but a multi-layer circuit substrate that does not have the core layer 210 may be used instead. In the above embodiment, the respective components that are mounted on the top surface of the circuit substrate 200 are exposed, but it is also possible to provide a case that covers the entire top surface or a part of the top surface of the circuit substrate 200, or to seal the top surface using a resin or the like.

What is claimed is:

1. A high-frequency circuit module, comprising:
a circuit substrate having laminated insulating layers and conductive layers;
a high-frequency IC that performs a transmission process and a reception process for a high-frequency signal;
a power amplifier IC that amplifies a transmission signal from the high-frequency IC; and
a duplexer that separates a transmission signal and a reception signal, the transmission signal being outputted from the power amplifier IC toward an antenna, the reception signal being inputted from the antenna toward the high-frequency IC,
wherein a wiring length of a signal line that is used for sending a transmission signal that has been amplified by the power amplifier IC to the duplexer is shorter than a signal line that is used for sending to the power amplifier IC a transmission signal that is outputted from the high-frequency IC and that has not been amplified,
wherein the power amplifier IC is mounted in a peripheral portion of the circuit substrate, and
wherein the circuit substrate comprises:
a core layer that is thicker than other conductive layers;
a terminal electrode formed in a peripheral portion on a bottom surface of the circuit substrate;
a ground electrode that is formed in a region inside of an area where the terminal electrode is formed on the bottom surface of the circuit substrate; and
a via conductor for heat dissipation that connects the ground electrode to the core layer.

2. The high-frequency circuit module according to claim 1, wherein the duplexer is mounted on the circuit substrate.

3. The high-frequency circuit module according to claim 1, wherein the duplexer is embedded in the circuit substrate.

4. The high-frequency circuit module according to claim 1, wherein at least a portion of the duplexer is disposed between the high-frequency IC and the power amplifier IC.

5. The high-frequency circuit module according to claim 1, wherein the high-frequency IC and the power amplifier IC are mounted on a top surface of the circuit substrate.

6. The high-frequency circuit module according to claim 1, wherein in a side view, the duplexer is disposed in a level different from a level in which the high-frequency IC and the power amplifier IC are disposed.

7. The high-frequency circuit module according to claim 1, wherein a wiring length of a signal line that is used for sending a reception signal from the duplexer to the high-frequency IC is shorter than a signal line that is used for sending to the power amplifier IC a transmission signal that is outputted from the high-frequency IC and that has not been amplified.

8. A high-frequency circuit module comprising:
a circuit substrate having laminated insulating layers and conductive layers;
a high-frequency IC that performs a transmission process and a reception process for a high-frequency signal;
a power amplifier IC that amplifies a transmission signal from the high-frequency IC; and
a duplexer that separates a transmission signal and a reception signal, the transmission signal being outputted from the power amplifier IC toward an antenna, the reception signal being inputted from the antenna toward the high-frequency IC,
wherein a wiring length of a signal line that is used for sending a transmission signal that has been amplified by the power amplifier IC to the duplexer is shorter than a signal line that is used for sending to the power amplifier IC a transmission signal that is outputted from the high-frequency IC and that has not been amplified,
wherein the power amplifier IC is mounted in a peripheral portion of the circuit substrate,
wherein the circuit substrate comprises:
a conductive layer as a core layer that is thicker than other conductive layers and that functions as a ground;
a terminal electrode formed in a peripheral portion on a bottom surface of the circuit substrate;
a first via conductor for heat dissipation that connects a bottom surface of the power amplifier IC to the core layer;
a ground electrode that is formed in a region inside of an area where the terminal electrode is formed on the bottom surface of the circuit substrate; and
a second via conductor for heat dissipation that connects the ground electrode to the core layer.

9. The high-frequency circuit module according to claim 8, wherein the duplexer is mounted on the circuit substrate.

10. The high-frequency circuit module according to claim 8, wherein the duplexer is embedded in the circuit substrate.

11. The high-frequency circuit module according to claim 8, wherein at least a portion of the duplexer is disposed between the high-frequency IC and the power amplifier IC.

12. The high-frequency circuit module according to claim 8, wherein the high-frequency IC and the power amplifier IC are mounted on a top surface of the circuit substrate.

13. The high-frequency circuit module according to claim 8, wherein in a side view, the duplexer is disposed in a level different from a level in which the high-frequency IC and the power amplifier IC are disposed.

14. The high-frequency circuit module according to claim 8, wherein a wiring length of a signal line that is used for sending a reception signal from the duplexer to the high-frequency IC is shorter than a signal line that is used for sending to the power amplifier IC a transmission signal that is outputted from the high-frequency IC and that has not been amplified.

15. A high-frequency circuit module, comprising:
  a circuit substrate having laminated insulating layers and conductive layers;
  a high-frequency IC that performs a transmission process and a reception process for a high-frequency signal;
  a power amplifier IC that amplifies a transmission signal from the high-frequency IC; and
  a duplexer that separates a transmission signal and a reception signal, the transmission signal being outputted from the power amplifier IC toward an antenna, the reception signal being inputted from the antenna toward the high-frequency IC,
  wherein a wiring length of a signal line that is used for sending a reception signal from the duplexer to the high-frequency IC is shorter than a signal line that is used for sending to the power amplifier IC a transmission signal that is outputted from the high-frequency IC and that has not been amplified,
  wherein the power amplifier IC is mounted in a peripheral portion of the circuit substrate, and
  wherein the circuit substrate comprises:
  a core layer that is thicker than other conductive layers;
    a terminal electrode formed in a peripheral portion on a bottom surface of the circuit substrate;
    a ground electrode that is formed in a region inside of an area where the terminal electrode is formed on the bottom surface of the circuit substrate; and
    a via conductor for heat dissipation that connects the ground electrode to the core layer.

* * * * *